United States Patent [19]
Hogan et al.

[11] Patent Number: 5,288,526
[45] Date of Patent: Feb. 22, 1994

[54] VENTILATED CURING OVEN AND PREHEAT FLASH ZONE SYSTEM FOR CURING COATINGS ON CIRCUIT BOARDS

[75] Inventors: Patrick T. Hogan, Lorain; Richard G. Christyson, Lakewood, both of Ohio

[73] Assignee: Nordson Corporation, Westlake, Ohio

[21] Appl. No.: 16,230

[22] Filed: Feb. 11, 1993

[51] Int. Cl.$^5$ .............................................. B05D 3/06
[52] U.S. Cl. ..................... 427/492; 34/1 Y; 34/4; 34/18; 34/41; 118/58; 118/643; 427/96; 427/378; 427/508; 427/521; 427/558
[58] Field of Search .............. 118/58, 620, 643; 427/96, 492, 508, 521, 542, 558, 378, 379; 34/1 Y, 1 Z, 4, 18, 41

[56] References Cited

U.S. PATENT DOCUMENTS

| | | |
|---|---|---|
| 545,429 | 8/1895 | Lewis . |
| 856,996 | 6/1907 | Ouster et al. . |
| 1,141,930 | 6/1915 | Buch . |
| 2,203,241 | 6/1940 | Waldron . |
| 2,389,586 | 11/1945 | Andrews ............................. 34/68 |
| 2,390,007 | 11/1945 | Sherman . |
| 2,724,191 | 11/1955 | Kahn et al. ............................. 34/68 |
| 2,889,806 | 6/1959 | Conant ................... 118/643 |
| 3,060,057 | 10/1962 | Johnson . |
| 3,151,950 | 10/1964 | Newman et al. ..................... 427/542 |
| 3,228,113 | 1/1966 | Fannon, Jr. ................................. 34/7 |
| 3,259,557 | 7/1966 | Smith et al. . |
| 3,638,605 | 2/1972 | Grandgirard ....................... 118/643 |
| 4,336,279 | 6/1982 | Metzger ..................................... 34/4 |
| 4,535,548 | 8/1985 | Hyde ......................................... 34/4 |
| 4,646,446 | 3/1987 | Bubley ..................................... 34/4 |

Primary Examiner—Robert A. Dawson
Assistant Examiner—Sun Uk Kim
Attorney, Agent, or Firm—Howard M. Cohn

[57] ABSTRACT

Apparatus and process for curing conformal coatings on circuit boards being conveyed through a curing chamber within a UV oven. Warm air, exhausted from a lamp housing containing UV lamps for curing the coatings, is directed into a flash zone chamber through which the coated circuit boards are conveyed prior to entering the UV oven for flashing volatile constituents from the coatings and raising the temperature of the circuit boards.

21 Claims, 3 Drawing Sheets

VENTILATED CURING OVEN AND PREHEAT FLASH ZONE SYSTEM FOR CURING COATINGS ON CIRCUIT BOARDS

FIELD OF THE INVENTION

This invention relates to a system for curing protective conformal coating materials applied to circuit boards, and more particularly, to a system for flashing off volatile constituents of a conformal coating applied to circuit boards and raising the temperature of the circuit boards prior to curing and then curing the coating in an ultra-violet oven.

BACKGROUND OF THE INVENTION

Typically, printed circuit boards are protected from moisture, electric leakage and dust with a coating of a moisture proof insulative film, known as a conformal coating, such as an acrylic, polyurethane, silicone or epoxy synthetic resin. Since the coatings are often dissolved in volatile solvents, the coated circuit boards are usually transported through a flash chamber to flash off the volatile solvents prior to curing. Then, the coated circuit boards are transported through a curing chamber and subjected to ultra-violet ("UV") light to initiate the polymerization process for curing the conformal material. The UV lights, while necessary for curing the conformal coating material, have significant disadvantages, primarily relating to the considerable amount of heat which they emit.

In a high volume production process, such as typically used in manufacturing circuit boards, two or more UV lights are often employed to cure the conformal coating material. Because of the considerable heat that these lights generate, there are problems relating to the rate of temperature rise and the maximum temperature of the circuit boards within the curing chamber.

Concerning the rate of temperature rise, there is a chance that the electronic components mounted on the circuit board can be damaged. In particular, when the electronic components are surface mounted to the circuit boards, significant stresses can be generated in the solder joints mounting the components due to the rapid rise in temperature. These stresses often lead to fracture of the joints and sometimes cause components to pop off the board. Moreover, in some circumstances, these stresses can damage, e.g. fracture, the circuit board itself. Therefore, the maximum rate of temperature rise is typically specified to be about 2° centigrade per second. However, the specific rate can vary depending upon the particular application and materials.

The other concern is to insure that the electric or electronic devices mounted to the circuit boards do not exceed a specified maximum temperature during manufacture. The temperature which the electronic devices attain relates to the temperature within the curing chamber and the amount of time that the circuit board stays within the curing chamber. If the temperature that the electronic devices reach is too high, typically above about 85° centigrade, the electronic components can be damaged. Here again, the temperature limitations are dependent upon the specific materials and components forming the circuit board assemblies.

Another important factor to be considered in curing conformal coatings is the importance of driving off any volatile solvents before initiating the curing process. If solvents remain in the conformal material during the curing step, they can produce bubbles in the cured coating and degrade the electrical and insulative properties of the completed board. In some cases, the coated boards are simply stored until the solvents flash off, typically several minutes to several hours. To reduce the time required to flash off the volatiles, circuit boards are sometimes subjected to heat, generated by means such as electric heaters. However, this is costly and reduces the profit for each completed circuit board.

Another problem with the prior art systems is that the conformal coatings applied on printed circuit boards to protect them from moisture, electric leakage and dust often do not have a uniform thickness. For example, an uneven coating can result when the coating is applied by a spray gun of the type disclosed in U.S. Pat. No. 5,141,165, which is hereby incorporated by reference in its entirety. Therefore, even when the volatile solvents, typically dissolved in the conformal coatings, are completely flashed off before curing, the final cured coating can still have poor performance because some areas are too thin and therefore unable to provide desired electrical and insulative properties. While simply increasing the thickness of the coating being applied can solve this problem, the cost of the additional conformal material and the impact on the environment from the release of the extra solvents makes this only a partial solution to the problem.

OBJECTS AND SUMMARY OF THE INVENTION

It is an object of the present invention to provide apparatus and processes for flashing off solvents and curing conformal material coated on printed circuit boards that obviate the problems and limitations of the prior art systems.

It is a further object of the present invention to provide apparatus and processes for flashing off solvents and volatiles in conformal material coated on printed circuit boards by exposing just the applied conformal coating material to heated air to both reduce the time needed to flash off volatile solvents and level off the conformal coating material applied to the circuit boards.

It is still a further object of the present invention to provide apparatus and processes for flashing off solvents and curing conformal material coated on printed circuit boards whereby the printed circuit boards are gradually brought up to the desired curing temperature to reduce the likelihood of generating stresses that might damage the connections between the circuit boards and electronic components thereon.

It is a yet further object of the present invention to provide apparatus and processes for curing conformal coatings on printed circuit boards with UV lamps while preventing the hot air used to cool the UV lamps from directly impacting and possibly damaging the circuit boards or the electronic components thereon.

It is a still further object of the present invention to provide apparatus and processes for flashing off volatiles from a conformal coating on a printed circuit board before curing the coating within a UV oven by passing warm air generated within the UV oven over the uncured coating.

It is yet a still further object of the present invention to provide apparatus and processes for leveling off a conformal coating on printed circuit boards before curing the coating within a UV oven by passing warm air generated within the UV oven over the uncured coating before the circuit board enters the UV oven.

In accordance with the invention, a system is set forth for curing coatings on substrates, such as circuit boards, comprising a UV oven having a curing chamber for curing the coatings of the substrates conveyed therethrough. A UV lamp housing within the UV oven contains a source of UV light. The lamp housing has a first opening for directing UV light into the curing chamber for curing the coatings of the substrates conveyed through the curing chamber and a second opening for venting warm air from within the lamp housing. A blower means blows air into the lamp housing whereby a first portion of the air flows across the source of UV light and exhausts as hot air through the first opening into the curing chamber and a second portion of air for cooling the lamp housing exhausts as warm air through the second opening. Means are provided for directing the warm air from the second opening of the UV lamp housing into a flash zone chamber means located upstream from the UV oven to flash off volatile constituents from the coatings on the circuit boards and gradually raise the temperature of the circuit boards conveyed through the flash zone chamber means towards the curing chamber.

Also in accordance with the invention, the means for directing the warm air into the flash zone chamber includes a deflection plate for directing the warm air from the second opening out of the inlet opening into the curing chamber through which the substrates travel from the flash zone chamber into the curing chamber. The deflection plate is adjustable for directing the flow of air across the circuit boards in the upstream direction counter to the flow direction of the circuit boards while preventing UV light within the curing chamber from impinging upon the coatings on the circuit boards while the circuit boards are still within the flash zone chamber. Moreover, the deflection plate is constructed from thermally conductive material to serve as a heat exchanger by absorbing heat from the curing chamber and directing that heat into the flash zone chamber by means of the air flow passing over the deflector plate.

Still further in accordance with the invention, an exhaust means is connected with the curing chamber for blowing air across the substrates travelling through the curing chamber whereby the substrates are cooled and hot air from the first opening is substantially prevented from impacting upon the substrates while the coating upon the substates is being cured. The exhaust means includes an outlet port of a blower located at one side of the curing chamber for blowing ambient air perpendicular to the flow direction of the substrates through the curing chamber and a vent opening disposed on the opposite side of the curing chamber from the outlet port for exhausting the ambient air mixed with the hot air from the first opening and volatiles from the coatings. A baffle plate can be disposed directly in front of the outlet port of the blower to prevent direct impact of some or all of the air from the blower on the substrates travelling through the curing chamber.

In accordance with the invention, a process of curing conformal coatings on circuit boards being conveyed through a UV oven comprises the following steps: (1) Warm air, exhausted from the lamp housing of a U.V. oven is directed into a flash zone chamber through which the coated circuit boards are conveyed from the coating operation prior to entering the UV oven for flashing volatile constituents from the coatings and raising the temperature of the circuit boards. During this step, the warm air flow tends to level off the coatings prior to the curing of the coatings in the curing chamber. Also during this step, the curing chamber is separated from the flash zone chamber by a deflection plate so that the UV light is prevented from impinging upon the coated circuit boards while they are in the flash zone chamber with the deflection plate serving as a heat exchanger to heat the air as well as deflect it. (2) The circuit boards are conveyed through the curing chamber within the UV oven so that UV light from the lamp housing containing UV lamps is directed onto coatings of the circuit boards for curing the coatings. (3) While in the curing chamber, air is blown across the circuit boards which are being conveyed through the curing chamber to deflect the hot used for cooling the UV lamps from directly impacting on the circuit boards and damaging them.

BRIEF DESCRIPTION OF THE DRAWINGS

The structure, operation, and advantages of the presently preferred embodiment of the invention will become further apparent upon consideration of the following description taken in conjunction with the accompanying drawings, wherein.

DETAILED DESCRIPTION OF THE INVENTION

Figure 1A:
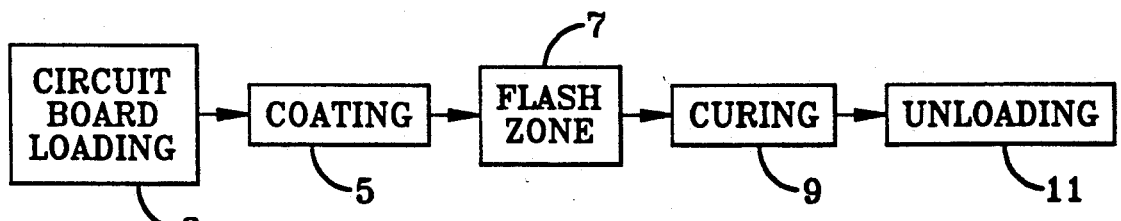
FIG. 1A is a schematic drawing showing the different operations of a circuit board coating and curing operation.

FIG. 1A shows in block diagrammatic form the different operations of a circuit board coating and curing operation system 10 for curing coatings on circuit boards 12. First, the circuit boards 12 which are to be coated with a conformal material are loaded into the system 10, as indicated by block 3. Then, the coating of the circuit boards with a conformal coating material occurs, as symbolized by block 5. Next, the circuit boards 12 are conveyed into a flash zone, as signified by block 7, for flashing off volatile constituents from the coatings and raising the temperature of the circuit boards. Continuing, the circuit boards enter a UV oven for curing the coatings, as indicated by block 9. The final step is the unloading of the coated circuit boards from system 10, as displayed by block 11.

Figure 1B:
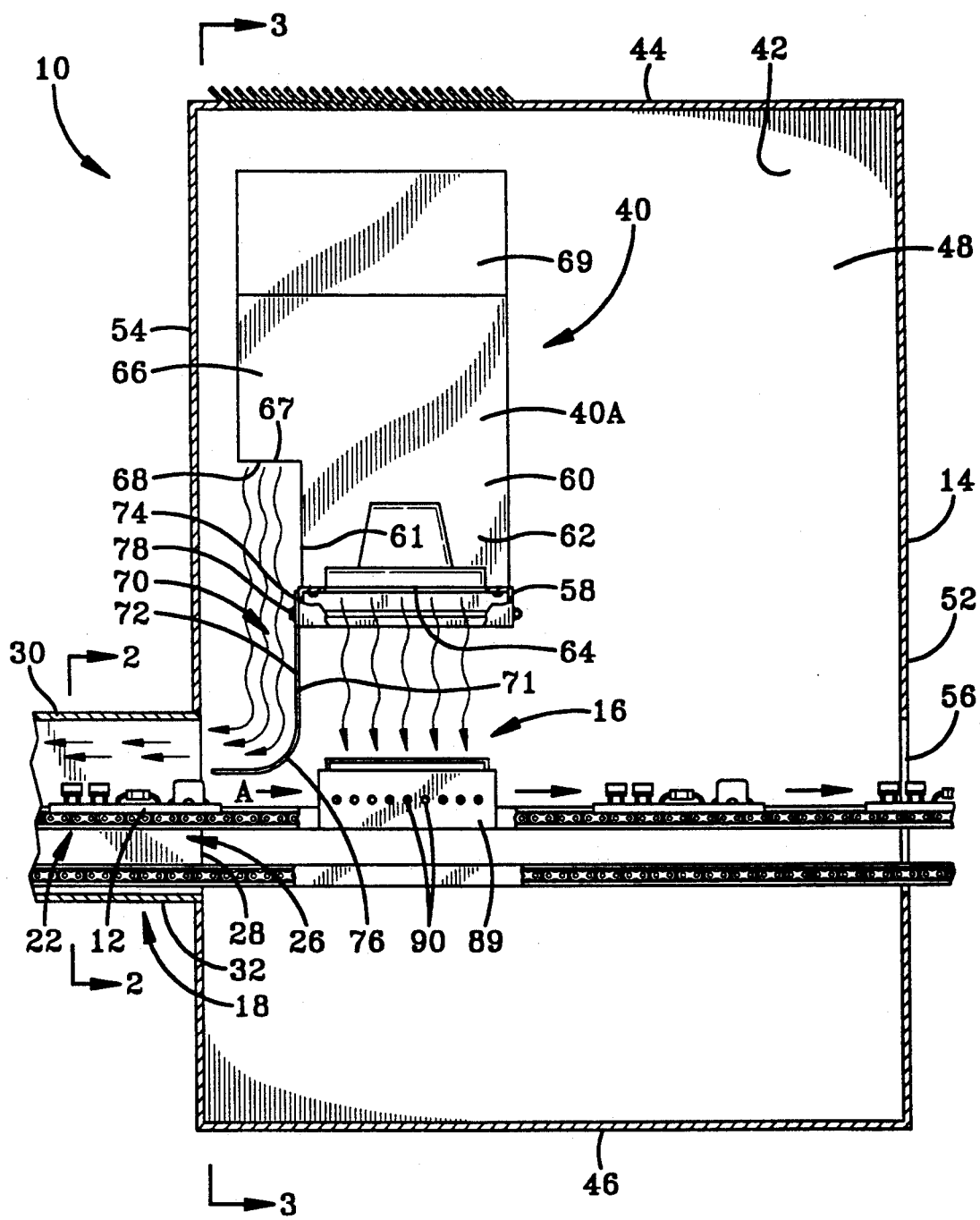
FIG. 1B is a side elevational view, partly in cross section, of a system for curing conformal coatings on circuit boards showing a UV oven and a part of the flash zone chamber in accordance with the present invention.

Referring to FIG. 1B, a system 10 for curing coatings on substrates 12, typically circuit boards, includes a UV oven 14 having a curing chamber means 16 and a flash off zone chamber means 18, in accordance with the present invention. Generally, the circuit boards 12 are coated with a conformal coating material in a coating chamber, shown in FIG. 1A, which is located upstream from UV oven 14. The circuit boards are then transported by means 22 for conveying, such as a conventional conveyor device, through flash off zone chamber means 18 and then through curing chamber means 16 within UV oven 14.

Figure 2:
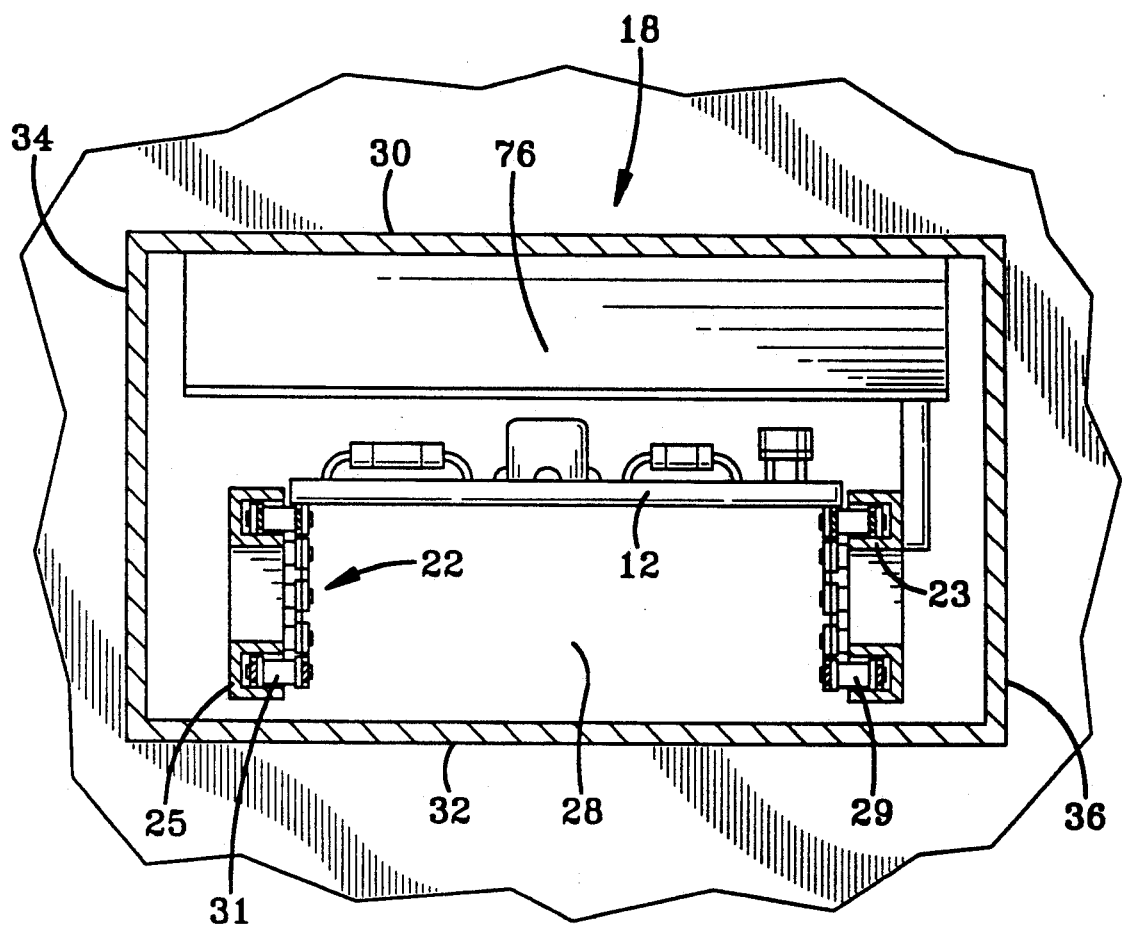
FIG. 2 is a view taken along line 2—2 of FIG. 1 illustrating the flash zone chamber.
Figure 3:
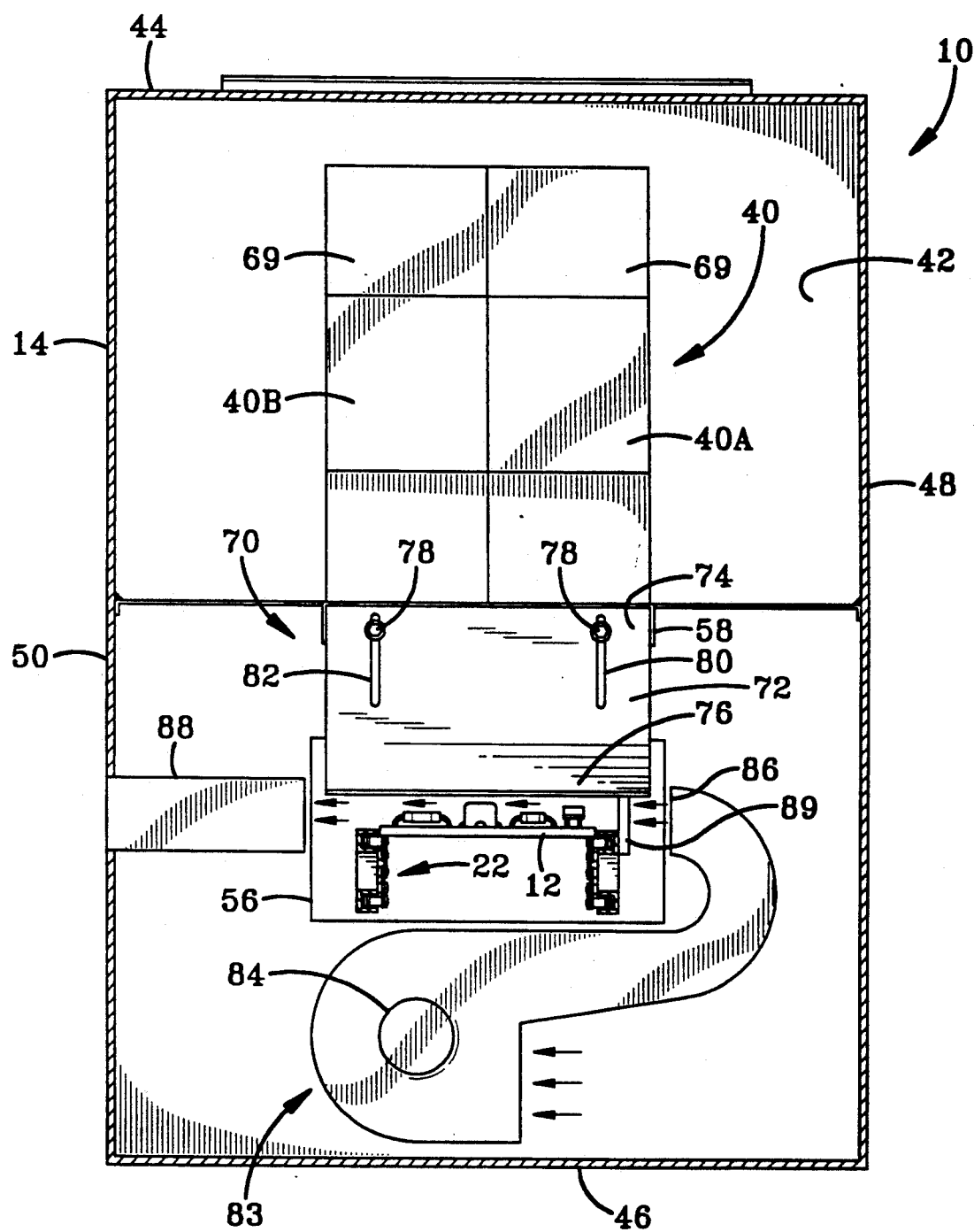
FIG. 3 is a view taken along line 3—3 of FIG. 1 illustrating the interior of the UV oven including the UV lamps, a deflector plate for directing warm air into the flash zone chamber and an exhaust system for blowing air over the circuit boards passing through the curing chamber of the UV oven.

The circuit boards 12, typically having a plurality of electrical or electronic components attached thereto, travel along a flow path from left to right, as denoted by arrow A in FIG. 1B, along the upper pass of the conveyor device 22. As best shown in FIG. 2, the conveyor device can be constructed of spaced, upper and lower parallel channels 23 and 25 with endless chains 29 and 31 moving therein. Referring to FIGS. 1B, 2 and 3, the circuit boards initially enter the inlet of enclosed flash zone chamber 18 and after travelling through chamber 18, exit from outlet section 26 of chamber 18 and flow into an inlet opening 28 in the UV oven 14. The flash zone chamber means 18 is generally a housing constructed from top and bottom walls 30 and 32 and side walls 34 and 36 forming a rectangular cross section, as illustrated in FIG. 2. The outlet section 26 of flash zone chamber 18 is abutted against the inlet opening 28 of oven 14 through which the circuit boards 12 travel into the curing chamber means 16 and warm air from UV lamp housing 40, discussed in detail below, exhausts into the flash off chamber means 18.

The overall construction of the UV oven 14 including the UV lamps 40 forms no part of this invention per se and is described only briefly herein. While two lamps 40A, 40B are illustrated, it is within the terms of the invention to incorporate any desired number of lamps as needed. The oven 14 is constructed of an enclosed housing 42 having top and bottom walls 44 and 46, side walls 48 and 50 and front and back walls 52 and 54. The oven 14 can be supported on a base structure, not shown. The walls 52 and 54 have inlet and outlet openings 28 and 56, respectively, through which conveyor 22 extends to carry the circuit boards into and out of the oven where they are cured within curing chamber 16.

A support frame 58, supported by side walls 48,50 within oven 14, provides an adjustable support for positioning lamps 40 at a desired distance with respect to the circuit boards travelling thereunder. Frame 58 could, for example, be mounted to walls 48,50 by means of bolts (not shown) through parallel elongated, vertically disposed slots (not shown). The individual lamps 40A and 40B, such as Model F-300 microwave powered lamps, manufactured by Fusion Systems Co. of Rockville Md., include a bulb and reflector housing assembly 60 having a first portion 62 containing a source of UV light, i.e., a UV bulb. The housing assembly 60 is generally rectangular in cross section and rests in support frame 58 so that a first light emitting opening 64 faces the conveyor 22. An irradiator screen (not shown) is secured over opening 64 and vents a flow of hot air, carrying heat away from the lamp bulb, towards the conveyor 22. The housing 60 includes a second portion 66, integrally formed with the first portion 62, which is wider than the first portion 62 and has a lower wall 68 with a second exhaust opening 67, such as a plurality of through holes (not shown), to exhaust a flow of warm air carrying heat generated within lamp housing assembly 60. The flow of warm air exiting through the second exhaust opening 67 does not flow across the hot lamp bulbs and is therefore not as hot as the hot air emitted from light emitting opening 64.

A blower 69 is mounted to the bulb and reflector housing assembly 60 to blow air therethrough. In the preferred embodiment, the blower develops about 200 cubic feet per minute (CFM) which is divided so that about 140 CFM of air flows across the lamp bulb and exhausts as hot air through light emitting, first opening 64 and the remaining 60 CFM of air exhausts as warm air through the second opening 67 in wall 68.

Means 70, including the interior walls of second portion 66 of the UV oven, the forward wall 61 of bulb and reflector assembly 60, and a deflection plate means 72, directs the warm air exhausting from the exhaust opening 67 in wall 68 out of inlet opening 28 and into the flash off chamber 18. The deflection plate 72 is generally flat, rectangular plate having one end 74 that is secured to the support frame 58 and an opposite free end 76 which is curved towards the inlet opening 28 to direct the downwardly flowing warm air out off the inlet opening 28 into flash zone chamber 18 in t he upstream direction counter to the flow direction "A" of the circuit boards therethrough.

The deflection plate 72 is adjustably mounted to support frame 58 by conventional means such as bolts 78 through parallel, elongated slots 80 and 82. The adjustable mounting enables the deflection plate 72 to be positioned with the free end 76 close to the conveyor 22 without interfering with the circuit boards 12 travelling through the oven. Besides directing the flow of warm air into flash off chamber 18, deflection plate 72 prevents exposure of the coated circuit boards to UV light prior to entering the oven 14 which would begin the curing process of the UV curable coatings. Moreover, the deflector plate absorbs infrared energy emitted by the UV lights, as discussed more fully below, and directs the energy as heat into the flash zone chamber. Another feature of the deflection plate 72 is to shape the flow of warm air so that it tends to level off the uncured coating material. Further, the back side 71 of plate 72 effects UV light into the curing chamber onto the circuit boards.

Referring to FIG. 3, there is illustrated an exhaust means 83 which includes a blower 84, such as a 400 CFM fan, having an outlet port 86 located on one side of conveyor 22 within the curing chamber 16. Directly across the conveyor 22 from the outlet port 86 of blower 84, on the opposite side of the curing chamber, is an exhaust vent opening 88 which exhausts the air from blower 84, as well as heated air from opening 64 of lamps 40, from the oven.

A baffle plate 89, illustrated as being secured to conveyor 22, can be disposed directly in front of blower outlet 86 to prevent direct impact of some or all of the air from blower 84 on the circuit boards travelling through the curing chamber 16, as discussed in more detail below. The baffle plate 89 can be constructed with a plurality of through holes 90 to allow a portion of the air to flow therethrough while the remainder is forced over the upper edge of the baffle plate 89 to control the amount of air which directly impacts the circuit boards or the coatings thereon.

Blower 84 directs ambient air substantially perpendicular to the flow path of circuit boards 12 to channel the hot air from light emitting opening 64 into the exhaust vent 88 to prevent direct impact of the hot air upon the circuit boards. Additionally, the blower directs cooling air across the circuit boards and electrical components thereon to reduce the rate of temperature rise and further reduce the maximum temperature reached by the circuit boards and the electrical components. As discussed above, the maximum temperature rise is preferably kept below about 2 degrees C. per second so that the stresses in the connection joints, typically solder, are kept below a level which would otherwise have a tendency to fracture. The maximum rate of temperature rise does not form a part of this invention and can be selected, as required. Moreover, the maximum temperature reached by the circuit boards and components thereon can be kept below a predetermined temperature of about 85 degrees C. by using the blower 84 in combination with the speed of conveyor 22.

While directing cooling air across the circuit boards is important, the air flow is preferably controlled so that the coating material is not disturbed and the circuit boards are not blown off the conveyor, usually into exhaust vent 88. The baffle plate 89, disposed between the blower 84 and the circuit boards, can be configured for specific applications so that a desired amount of air passes through holes 90 to impact directly on the circuit boards while the remainder of the air passes over plate 89 and into vent 88 without directly impacting the circuit boards.

In operation, the circuit boards are transported directly into the inlet section 24 of the flash off zone chamber 18 and travel downstream to the outlet section 26 at a rate of speed, typically between about 2 and 6 feet per minute, so that all of the volatile solvent constituents are flashed off from the conformal coating prior to the circuit boards exiting outlet section 26. The speed that the circuit boards travel is not a critical aspect of the present invention and any desired speed can be selected, depending upon factors such as but not limited to the coating materials, the percentage of solvent and the temperature and volume of air flow through the chamber. To accelerate the speed that the solvent flashes off, warm air exhausted from UV oven 14, as discussed in detail hereinbelow, is introduced into the outlet section 26 of flash off zone chamber 18 and directed upstream against the flow direction of the circuit boards. The warmed air, after picking up the flashed off solvents, exits the inlet of chamber 18, usually into the coating chamber wherefrom it is exhausted from system 10.

The warm air flow through flash zone chamber 18 serves three primary functions. First, the warm air accelerates the flashing of the volatile constituents from the coating material so that all of the volatile solvent constituents are flashed off before the coated circuit boards leave the flash off zone chamber 18 and enter the adjacent curing chamber 16 in oven 14. This is an important function in that it prevents bubbles of trapped solvent vapors from forming bubbles within the final cured coating which would reduce the electrical and insulative performance of the coating. Second, the coating material, which is typically still wet when the circuit boards enter the flash zone chamber, is usually unevenly distributed across the circuit board. The flow of warm air across the coating material serves to heat the coating material and reduce its viscosity so that it can more easily flow and level off. A levelled off, cured coating without entrapped bubbles insures consistent electrical and insulative performance. Third, the warm air preheats the circuit board and the electronic components affixed thereto to reduce the circuit boards' rate of temperature rise in the curing chamber because the circuit boards enter the curing chamber at a higher temperature. The rate of temperature rise and the maximum temperature permitted, as determined by the speed of conveyance through the system, the flow rate of the warm air into the flash off chamber, the flow rate of cooling air from the ventilating system, and the UV lamp settings, are selected in accordance with the specific coating material and the construction of the circuit boards.

As seen in FIG. 1, the circuit boards 12 pass under the free end 76 of deflector plate 72 into the curing chamber 16 of UV oven 14. UV lamps 40A and 40B are positioned to direct UV light onto the circuit boards being conveyed thereunder. The bulbs typically operate in a temperature range of about 850 degrees centigrade (C.). The bulbs emit UV, IR visible light and covective energy. The UV and the IR light waves have significant amounts of heat, as does the covective heat component. An air blower 69, located above the UV lamps, blows air over the UV bulbs into the curing chamber as well as out of second exhaust opening 68 and into the flash off chamber 18. For example, with a 200 CFM fan, about 140 CFM of air is directed over the bulbs and the remainder or about 60 CFM is directed out opening 68, through the inlet port 28 and into the flash off zone chamber 18.

In operation, the process begins with circuit boards 12 being conveyed by a conveyor 22 in a flow path from a coating chamber into a flash zone chamber 18 where the volatile constituents of the coating material are flashed off. To accelerate the flashing off process, warm air from the UV oven 14 is directed upstream through the flash zone chamber, against the flow of the circuit boards. The warm air flowing through flash off zone chamber 18 is preferably in the temperature range of about 80 to about 120 degrees Fahrenheit (F.). The flow rate, controlled by the blower 89, is preferably about 40 to about 80 CFM. The heat directed into chamber 18 also includes the heat absorbed from curing chamber 16 by the deflector plate 72. The deflector plate 72 is positioned so that UV light does not impact the coating on the circuit boards within the flash off chamber and the air flow is adjusted so that the circuit board and electrical components are prewarmed before entering the curing chamber. Moreover, the coating material is levelled and the volatilization of the volatile constituents is substantially completed before the circuit boards enter the curing chamber within the UV oven.

The process continues with the circuit boards travelling through curing chamber 16. Blower 84 directs air across the flow path of the circuit boards to prevent the direct impact of hot air from the UV light bulbs on the circuit boards. Besides controlling the rate of temperature rise of the circuit boards, the direction of the air from blower 84 is controlled, such as with a baffle 89, so that the coating on the circuit boards is not disturbed and the circuit boards are not blown off the conveyor and into vent 88. It is also within the terms of the invention to place baffles within the exhaust port 86 of the blower 84 to reduce the amount of flow or control the flow direction of ambient cooling air which is emitted therefrom.

While the conformal coatings described herein have volatile solvents as constituents, it is also within the terms of the invention to use conformal coatings free of volatile solvents.

It is apparent that there has been provided in accordance with this invention apparatus and processes for flashing off volatile constituents of conformal coatings and levelling the coatings prior to curing using warm air from the air exhaust of the UV lamp enclosure. In addition, the rate of temperature rise and maximum temperature reached by the circuit boards and components affixed thereto, as they travel through the UV oven, are controlled to prevent their exceeding specified limits so as to satisfy the objects, means and advantages set forth hereinbefore.

While the invention has been described in combination with embodiments thereof, it is evident that many alternatives, modifications, and variations will be apparent to those skilled in the art in light of the foregoing description. Accordingly, the invention is intended to embrace all such alternatives, modifications and variations as fall within the spirit and broad scope of the appended claims.

We claim:

1. A system for curing coatings on substrates, comprising:
   a UV oven having a curing chamber for curing the coatings of said substrates conveyed therethrough;
   a UV lamp housing within said UV oven containing a source of UV light, said lamp housing including an opening for directing UV light into said curing chamber to cure the coatings of said substrates conveyed through said curing chamber;
   blower means for blowing air into said lamp housing whereby a first portion of said air flows across said source of UV light and exhausts as hot air into said curing chamber and a second portion of said air for cooling said lamp housing exhausts as warm air into a flash zone chamber means located upstream from said UV oven for flashing off volatile constituents from said coatings on said substrates and raising the temperature of said substrates conveyed through said flash zone chamber means.

2. The apparatus of claim 1 wherein said lamp housing includes:
   a first opening for directing UV light into said curing chamber and exhausting hot air from said lamp housing; and
   a second opening for venting warm air from said lamp housing into said flash zone chamber means.

3. The apparatus of claim 2 further including means for directing said warm air from said second opening of said UV lamp housing into said flash zone chamber means for flashing off volatile constituents and raising the temperature of said substrates.

4. The apparatus of claim 3 wherein said means for directing said warm air into said flash zone chamber means includes deflection plate means for directing said warm air from said second opening and out of an inlet opening of said UV oven through which said substrates travel from said flash zone chamber means to said curing chamber.

5. The apparatus of claim 4 wherein said deflection plate means includes a deflection plate which is adjustable for directing the flow of air across said substrates in the upstream direction counter to the flow path of said substrates and for preventing UV light within said curing chamber from impinging upon said coatings while said substrates are still within said flash zone chamber means.

6. The apparatus of claim 5 wherein said deflection plate absorbs heat from within said curing chamber and directs the heat into said flash zone chamber means.

7. The apparatus of claim 2 further including exhaust means connected with said curing chamber for blowing air across said substrates travelling through said curing chamber whereby said substrates are cooled and hot air from said first opening is substantially prevented from impacting upon said substrates.

8. The apparatus of claim 7 wherein said exhaust means includes an outlet port of a blower located at one side of said curing chamber for blowing ambient air normal to the flow direction of said substrates through said curing chamber and a vent opening connected to the other side of said chamber for exhausting the ambient air mixed with the hot air from said first opening.

9. The apparatus of claim 5 further including exhaust means connected with said curing chamber for blowing air across said substrates travelling through said curing chamber whereby said substrates are cooled and hot air from said first opening is substantially prevented from impacting upon said substrates.

10. The apparatus of claim 9 wherein said exhaust means includes a blower located at one side of said curing chamber for blowing ambient air from an outlet port substantially normal to the flow direction of said substrates through said curing chamber and a vent opening located at the other opposite side of said curing chamber from said outlet port for exhausting the ambient air mixed with the hot air from said first opening.

11. The apparatus of claim 9 wherein said substrates are circuit boards.

12. The apparatus of claim 1 including means for conveying said substrates initially through said flash zone chamber means and then through the curing chamber of said UV oven.

13. The apparatus of claim 12 wherein said means for conveying comprises an endless conveyor.

14. The apparatus of claim 4 wherein said flash zone chamber means is located directly adjacent to said inlet of said UV oven.

15. The apparatus of claim 1 wherein said source of UV light comprises one or more UV lamps.

16. The apparatus of claim 10 including a baffle plate disposed directly in front of said blower to prevent direct impact of some or all of said air blowing on the substrates travelling through said curing chamber.

17. A process of curing conformal coatings on circuit boards being conveyed through a UV oven, comprising the steps of:
   conveying said circuit boards through a curing chamber within said UV oven;
   directing UV light from a lamp housing containing UV lamps onto said coatings of said circuit boards for curing said coatings;
   blowing air into said lamp housing; and
   directing exhausted from said lamp housing into a flash zone chamber through which said coated circuit boards are conveyed prior to entering said UV oven for flashing volatile constituents from said coatings and raising the temperature of said circuit boards.

18. The process of claim 17 wherein said step of directing warm air includes the step of preventing said UV light from impinging upon said coated circuit boards within said flash zone chamber.

19. The process of claim 18 wherein said step of directing warm air includes the step of directing the flow of warm air across said circuit boards in the upstream direction counter to the flow path of said circuit boards whereby said coating is levelled off.

20. The process of claim 18 including the step of blowing ambient air across said circuit boards being conveyed through said curing chamber and mixing said ambient air with hot air from said UV lamps to prevent the hot air from directly impacting on said circuit boards.

21. The process of claim 20 including the step of preventing direct impact of some or all of the ambient air blowing across said circuit boards travelling through said curing chamber.

* * * * *

UNITED STATES PATENT AND TRADEMARK OFFICE
CERTIFICATE OF CORRECTION

PATENT NO. : 5,288,526
DATED : Feb. 22, 1994
INVENTOR(S) : Hogan et al.

It is certified that error appears in the above-indentified patent and that said Letters Patent is hereby corrected as shown below:

Column 6, line 15, "t he" appears instead of "the".

Column 10, line 44, "directing exhausted" appears instead of "directing warm air exhausted".

Signed and Sealed this

Second Day of August, 1994

BRUCE LEHMAN

*Attest:*

*Attesting Officer*     *Commissioner of Patents and Trademarks*